United States Patent [19]

Nonaka et al.

[11] 4,219,831

[45] Aug. 26, 1980

[54] TARGETS FOR USE IN PHOTOCONDUCTIVE IMAGE PICKUP TUBES

[75] Inventors: Yasuhiko Nonaka, Mobara; Naohiro Goto, Machida; Keiichi Shidara, Tama, all of Japan

[73] Assignees: Hitachi, Ltd.; Nippon Hoso Kyokai, both of Tokyo, Japan

[21] Appl. No.: 846,881

[22] Filed: Oct. 31, 1977

[30] Foreign Application Priority Data

Nov. 17, 1976 [JP] Japan ............................... 51-137293

[51] Int. Cl.$^{2}$ ............................................ H01L 27/14

[52] U.S. Cl. ........................................ 357/31; 357/16; 357/30

[58] Field of Search .................... 313/386; 357/31, 30, 357/16

[56] References Cited

U.S. PATENT DOCUMENTS

| | | | |
|---|---|---|---|
| 3,922,579 | 11/1975 | Goto | 313/366 |
| 4,007,395 | 2/1977 | Nonaka | 313/386 |
| 4,007,473 | 2/1977 | Nonaka | 357/31 |

*Primary Examiner*—Martin H. Edlow

*Attorney, Agent, or Firm*—Charles E. Pfund

[57] ABSTRACT

The target comprises a transparent substrate, an N-type transparent conductive film formed on the substrate, a P-type photoconductive film formed on the N-type conductive film and a heterojunction formed at the interface between the N- and P-type films. The P-type photoconductive film contains selenium, tellurium and arsenic of which selenium and arsenic are distributed continuously from the heterojunction throughout the thickness of the P-type photoconductive film whereas the distribution of tellurium is spaced from the heterojunction and localized in the vicinity of the heterojunction. The total amount of arsenic contained in the P-type photoconductive film ranges from 2.5 to 6% by weight.

4 Claims, 5 Drawing Figures

TARGETS FOR USE IN PHOTOCONDUCTIVE IMAGE PICKUP TUBES

BACKGROUND OF THE INVENTION

This invention relates to a target for use in a photoconductive image pickup tube and more particularly to a P-type photoconductive film having a novel composition.

In recent years, a target of the novel rectifying contact type for use in photoconductive image pickup tubes has been proposed wherein a heterojunction is formed between a P-type photoconductive film containing amorphous selinium, tellurium and arsenic and an N-type transparent conductive film. U.S. Pat. Nos. 4,007,473 and 4,007,395, both issued to Nonaka et al, dated Feb. 8, 1977 and assigned to the same assignee as the present application disclose a target for use in a photoconductive image pickup tube wherein the distribution of tellurium contained in the P-type photoconductive layer is spaced from the heterojunction and localized in the vicinity of the heterojunction. The targets disclosed in these patents are characterized in that the residual image and flare of the image are small, and that the targets have high resolution, less picture defect in the form of white spots and can be manufactured readily.

However in such targets, not only the sensitivity to the voltage impressed upon the target and the saturation characteristic are not sufficiently high, but also it has been impossible to suppress the dark current to a small value. As is well known in the art, when the sensitivity to the applied voltage and the saturation characteristic are poor, there are such difficulties that it is nessary to increase the voltage applied to the target as the saturation lags and that the sensitivity decreases for all incident light as well as blue light. Morecover, a large dark current results in a great deterioration of the picture quality.

SUMMARY OF THE INVENTION

Accordingly, it is an object of this invention to provide an improved target of the type described above and utilized in photoconductive image pickup tubes wherein the sensitivity to the voltage impressed upon the target or saturation characteristics are satisfactory and the dark current is small.

Generally speaking, according to this invention this object is accomplished by selecting the total amount of arsenic incorporated into the P-type photoconductive film to an appropriate value.

According to this invention there is provided a target for use in a photoconductive image pickup tube of the type comprising a transparent substrate, an N-type transparent conductive film disposed on the substrate, a P-type photoconductive film deposited on the N-type transparent conductive film, and a heterojunction formed at the interface between the N-type transparent conductive film and the P-type photoconductive film, the P-type photoconductive film containing selenium, tellurium and arsenic, the selenium and arsenic being distributed continuously from the heterojunction throughout the thickness of the P-type photoconductive film and the distribution of the tellurium being spaced from the heterojunction and localized in the vicinity of the heterojunction, wherein the total amount of arsenic contained in the P-type photoconductive film ranges from 2.5 to 6% by weight.

The region in which tellurium distribution is localized has a thickness of less than 5000 Å.

In a modified embodiment, the target further comprises an N-type transparent semiconductor film interposed between the N-type transparent conductive film and the P-type photoconductive film, and a semiporous film formed on the back of the P-type photoconductive film.

DESCRIPTION OF THE PREFERRED EMBODIMENTS

Figure 1:
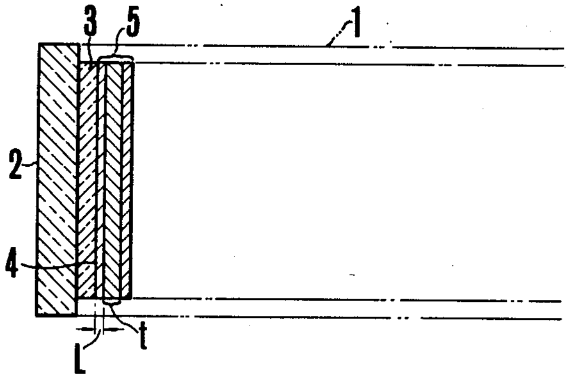
FIG. 1 is a schematic sectional view of a target for use in a photoconductive image pickup tube to which the present invention is applicable.

As diagrammatically shown in FIG. 1, the target structure for use in a photoconductive image pickup tube 1 comprises a transparent substrate 2 sealed to the front surface of the pickup tube. An N-type transparent conductive film 3 is provided for the rear surface of the substrate 2 and a P-type photoconductive film 5 is formed on the back of the film 3. A heterojunction 4 is formed between the N-type transparent conductive film 3 and the P-type photoconductive film 5. Accordingly, the N-type transparent conductive film 3 and the P-type photoconductive film 5 form a rectifying contact therebetween. The N-type transparent conductive film 3 comprises indium oxide, stannic oxide, a mixture of indium oxide and stannic oxide or a mixture of stannic oxide and antimony.

When the P-type photoconductive film 5 usually having a thickness of several microns consists of only amorphous selenium, there are such disadvantages that the sensitivity to red light is not sufficiently high and that because of easy crystallization of the amorphous selenium at a relatively low temperature, picture defect in the form of white spots tends to appear. To solve this problem, it has been proposed to add tellurium acting as an intensifier to red light to the P-type photoconductive film by a peak amount of 20 to 40%, by weight, on the side of the N-type conductive film 3 in a region spaced by L from the heterojunction 4, the region being localized in a thickness of t (several hundred Å), and to add arsenic throughout the entire thickness of the P-type photoconductive film so as to increase the viscosity of amorphous selenium, thereby decreasing the crystallization speed.

Figure 3:
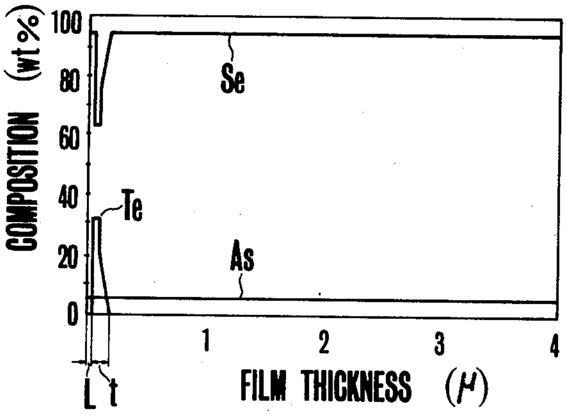
FIG. 3 is a graph showing the composition of a P-type photoconductive film.

FIG. 3 is a graph showing the distribution of the ingredients Se, As and Te of the composition of the P-type photoconductive film described above.

Figure 2:
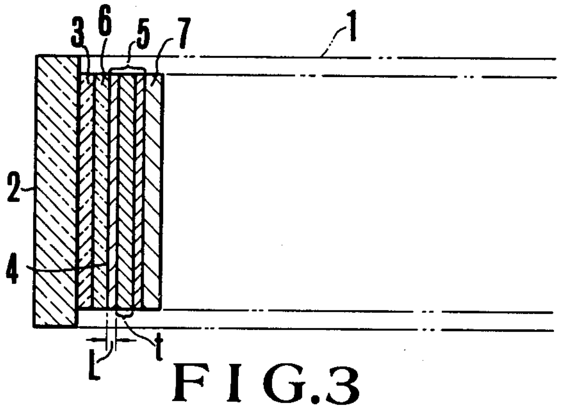
FIG. 2 is a schematic sectional view of another target to which the present invention is also applicable.

Another example of the target of the photoconductive image pickup tube shown in FIG. 2 comprises a transparent substrate 2, an N-type transparent conductive film 3 formed on the back of the substrate 2, an N-type transparent semiconductor film 6 formed on the back of the N-type transparent conductive film 3 and comprising an element selected from the group consisting of zinc selenide, germanium oxide and cerium oxide, a P-type photoconductive film 5 on the back of the N-type transparent semiconductor film 6 and a semiporous film 7 of antimony trisulfide having a thickness of about 1000 Å and formed on the rear side of the P-type photoconductive film 5. The N-type transparent semiconductor film 6 contributes to the reduction of the dark current during operation and the reduction of the white spot. The semiporous film 7 contributes to the improvement in the landing characteristic of electron beams.

A heterojunction 4 is formed at the interface between the N-type transparent semiconductor film 6 and the P-type photoconductive film 5.

For example shown in FIG. 2, the distribution of the ingredients Se, As and Te of the P-type photoconductive film 5 is also shown by FIG. 3.

It is considered to form the selenium-arsenic containing region of P-type photoconductive film 5 onto the N-type transparent conductive film 3 or N-type transparent semiconductor film 6 by vapor-depositing a mixture of selenium and arsenic and to form the selenium-tellurium-arsenic containing region of P-type photoconductive film 5 by vapor-depositing a mixture of selenium, tellurium and arsenic. However, the vapor-deposition of the mixture is disadvantageous in that ingredients of the mixture tend to segregate. Further, it is difficult to accurately control the quantity of ingredients in the vapor-deposited film.

For these reasons, it is advantageous to form the P-type photoconductive film 5 of the image pickup tubes shown in FIGS. 1 and 2 by individually vapor-depositing a single substance of selenium, tellurium and arsenic in a thickness of less than 100 Å onto the N-type transparent conductive film 3 or the N-type transparent semiconductor film 6 for the purpose of stably and accurately controlling the contents of the composition. Because of the extremely small thickness, individuality of each single substance disappears and the resultant lamination is a compound-like film. Specifically, for the selenium-arsenic containing region, a single substance of selenium and a single substance of arsenic are vapor-deposited cyclically in order of selenium and arsenic or viceversa; for the selenium-tellurium-arsenic containing region, selenium, tellurium and arsenic single substances are vapor-deposited cyclically, for example, in order of selenium, tellurium and arsenic. A different cycle in order of tellurium, selenium and arsenic, for example, may of course be employed. Since arsenic is unstable in air, it is preferable to use an alloy containing arsenic as the major ingredient, for example, a compound $As_2Se_3$. Similarly, an alloy of tellurium such as for example, a compound TeSe, may be used.

Figure 4:
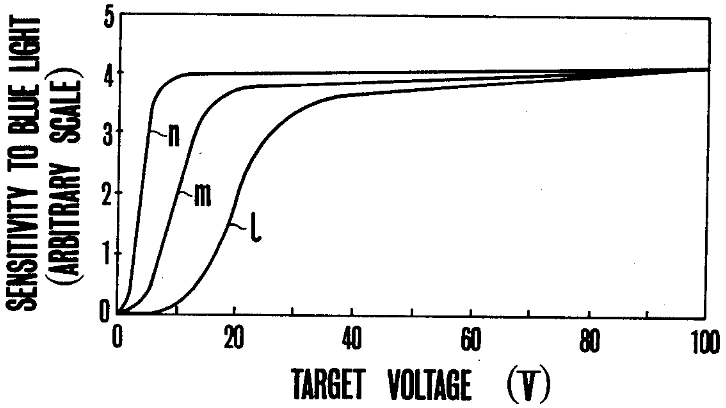
FIG. 4 is a graph showing the relationship betwen the voltage impressed upon the target and the sensitivity to blue light.

According to the result of our experiment, it was found that the arsenic incorporated into the P-type photoconductive film 5 consisting essentially of selenium acts not only to increase the viscosity of selenium but also to trap the hole carriers created by the incident light in the tellurium containing region. By measuring the sensitivity (to blue light) with respect to the voltage impressed upon the target, a saturation characteristic as shown in FIG. 4 was obtained in which curves l, m and n show the characteristics corresponding to a weight % of arsenic of 11, 8, and 5, respectively. As can be clearly noted from FIG. 4, the saturation characteristics are improved as the weight percent of arsenic decreases. In view of this result, it was found that satisfactory result could be obtained at a weight percent of arsenic of less than 8%, preferably less than 5%. Better result could be obtained by designing the thickness of the region t which contains tellurium acting as an intensifier to be less than 5000 Å as disclosed in U.S. Pat. No. 4,007,395 and by selecting the amount of tellurium to be in a range of from 0.20 to 1.50% by weight. Accordingly, the experimental results shown in FIG. 4 were obtained with a tellurium containing region thickness t of 1200 Å and 0.75 weight % of tellurium.

Figure 5:
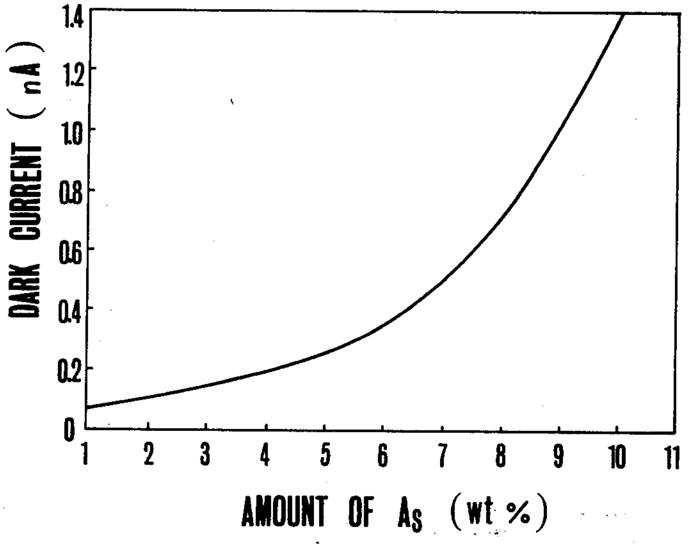
FIG. 5 is a graph showing the relationship between the amount of arsenic and dark current.

It was also found that the characteristic of the rectifying contact between the N-type transparent conductive film 3 or N-type semiconductor film 6 and the P-type photoconductive film 5 varies depending upon the amount of arsenic present on the heterojunction. More particularly, the relationship between the amount of arsenic and the dark current is shown by a graph of FIG. 5. As this graph shows, beyond 6 weight % of arsenic, the rectifying contact is degraded and the dark current increases rapidly. For this reason, less than 6% by weight of arsenic is preferred.

However, when the amount of arsenic is too small, the viscosity of the amorphous selenium increases, thus impairing the contemplated object of using arsenic for preventing crystallization, so that it is necessary to select the amount of arsenic in a range higher than 2.5% by weight. When the content of arsenic decreases inversion phenomenon occurs because amorphous selenium has a high resistance. The term "inversion phenomenon" is used herein to mean an inversion in the density or tone of the image of the pickup tube caused by the increase in the potential at the surface scanned with electron beams. This potential increase is caused by secondary electrons which take place on the scanning surface of the target when the amount of the electron beam that scans the scanning surface is large.

Summarizing the above, in order to obtain a satisfactory sensitivity the amount of arsenic should be in a range of from 2.5 to 8%, by weight, as shown in FIG. 3, preferably from 2.5 to 5%, by weight. To sufficiently decrease the dark current the upper limit should be less than 6% by weight.

Instead of arsenic, germanium of the same amount can also be used.

As above described in accordance with this invention, in a target for use in an image pickup tube as shown in FIGS. 1 and 2, since arsenic of the amount of from 2.5 to 8.0% by weight, preferably from 2.5 to 6% by weight, more preferably from 2.5 to 5% by weight is incorporated into a P-type photoconductive film and distributed in the film throughout its thickness, it is possible to improve the sensitivity and the saturation characteristic and to sufficiently decrease dark current without decreasing the viscosity of amorphous selenium.

What is claimed is:

1. In a target for use in a photoconductive image pickup tube of the type comprising a transparent substrate, an N-type transparent conductive film deposited on said substrate, a P-type photoconductive film deposited on said N-type transparent conductive film, and a heterojunction formed at the interface between said N-type transparent conductive film and said P-type photoconductive film, said P-type photoconductive film containing selenium, tellurium and arsenic, said selenium and arsenic being distributed continuously from said heterojunction throughout the thickness of said P-type photoconductive film and the distribution of said tellurium being spaced from said heterojunction and localized in the vicinity of said heterojunction, the improvement wherein the total amount of arsenic contained in said P-type photoconductive film ranges from 2.5 to 6% by weight for producing a dark current between 0.2 to 0.4 nA.

2. The target according to claim 1 wherein said tellurium contained in said P-type photoconductive film presents in a region having a thickness of less than 5000 Å and amounts in a range of from 0.20 to 1.5% by weight.

3. The target according to claim 1 which further comprises an N-type transparent semiconductor film interposed between said N-type transparent conductive film and said P-type photoconductive film, said semiconductor film being of a semiconductor selected from a group including zinc selenide, germanium oxide and cerium oxide, and a semiporous film formed on the back of said P-type photoconductive film.

4. The target according to claim 2 which further comprises an N-type semiconductor film interposed between said N-type transparent conductive film and said P-type photoconductive film, said semiconductor film being of a semiconductor selected from a group including zinc selenide, germanium oxide and cerium oxide, and a semiporous film formed on the back of said P-type photoconductive film.

* * * * *